US012751080B2

(12) United States Patent
Olson et al.

(10) Patent No.: US 12,751,080 B2
(45) Date of Patent: Sep. 29, 2026

(54) SEMICONDUCTOR STRUCTURE FORMING A PLURALITY OF TRANSISTORS

(71) Applicant: C2Amps AB, Lund (SE)

(72) Inventors: Simon Olson, Malmö (SE); Tobias Tired, Lund (SE); Stefan Andric, Lund (SE); Adam Jönsson, Malmö (SE); Lars-Erik Wernersson, Lund (SE); Lars Tilly, Lund (SE)

(73) Assignee: C2Amps AB, Lund (SE)

( * ) Notice: Subject to any disclaimer, the term of this patent is extended or adjusted under 35 U.S.C. 154(b) by 405 days.

(21) Appl. No.: 18/558,651

(22) PCT Filed: Apr. 29, 2022

(86) PCT No.: PCT/EP2022/061528
§ 371 (c)(1),
(2) Date: Nov. 2, 2023

(87) PCT Pub. No.: WO2022/233734
PCT Pub. Date: Nov. 10, 2022

(65) Prior Publication Data

US 2024/0222372 A1 Jul. 4, 2024

(30) Foreign Application Priority Data

May 3, 2021 (EP) .................................... 21171860

(51) Int. Cl.
*H10D 84/83* (2025.01)
*H10D 30/43* (2025.01)
(Continued)

(52) U.S. Cl.
CPC ............ *H10D 84/83* (2025.01); *H10D 30/43* (2025.01); *H10D 30/6735* (2025.01);
(Continued)

(58) Field of Classification Search
CPC .... H10D 84/83; H10D 30/43; H10D 30/6735; H10D 62/10; H10D 62/122; H10D 1/714; H10D 84/016; H10D 84/038
See application file for complete search history.

(56) References Cited

U.S. PATENT DOCUMENTS

2008/0157222 A1* 7/2008 Wang .................... H10D 84/83
257/E27.06
2016/0240623 A1* 8/2016 Chang .................. H10D 30/43
(Continued)

FOREIGN PATENT DOCUMENTS

EP 1939940 A2 7/2008
EP 1939940 A3 6/2009

OTHER PUBLICATIONS

Gonzalez-Diaz Victor R et al: "Improving linearity in MOS varactor based VCOs by means of the output quiescent bias point", Integration, the VLSI Journal, North-Holland Publishing Company. Amsterdam, NL, vol. 55, Aug. 16, 2016 (Aug. 16, 2016), pp. 274-280, XP029763948, ISSN: 0167-9260, DOI: 10.1016/J.VLSI.2016.08.003 section 2. figure 1.

(Continued)

*Primary Examiner* — Ratisha Mehta
(74) *Attorney, Agent, or Firm* — Shih IP Law Group, PLLC

(57) ABSTRACT

A semiconductor structure forming a plurality of transistors is disclosed. The semiconductor structure comprising: a source layer; a plurality of vertical nanowires erecting from the source layer; a first spacer layer arranged on the source layer and around each of the plurality of vertical nanowires; a gate layer arranged on the first spacer layer and around each of the plurality of vertical nanowires; a second spacer layer arranged on the gate layer and around each of the plurality of vertical nanowires; and a drain layer arranged on the second spacer layer and in contact with each of the
(Continued)

plurality of vertical nanowires; wherein the gate layer comprises a first gate and a second gate each comprising a plurality of gate fingers, wherein the first gate comprises a first interconnecting gate portion interconnecting the gate fingers of the first gate, wherein the second gate comprises a second interconnecting gate portion interconnecting the gate fingers of the second gate, wherein the plurality of gate fingers of the first gate is interleaved with the plurality of gate fingers of the second gate, wherein the first gate is a gate of a first transistor and the second gate is a gate of a second transistor.

12 Claims, 6 Drawing Sheets

(51) Int. Cl.
*H10D 30/67* (2025.01)
*H10D 62/10* (2025.01)

(52) U.S. Cl.
CPC ......... *H10D 30/6757* (2025.01); *H10D 62/10* (2025.01); *H10D 62/122* (2025.01)

(56) References Cited

U.S. PATENT DOCUMENTS

| | | | | |
|---|---|---|---|---|
| 2020/0357930 | A1* | 11/2020 | Glass | H10D 30/6735 |
| 2022/0077143 | A1* | 3/2022 | Song | H10D 30/024 |

OTHER PUBLICATIONS

International Search Report from International Application No. PCT/EP2022/061528, mailed date Jul. 5, 2022.
Extended European Search Report (EESR) dated Oct. 5, 2021.

* cited by examiner

SEMICONDUCTOR STRUCTURE FORMING A PLURALITY OF TRANSISTORS

TECHNICAL FIELD

The present inventive concept relates to a semiconductor structure forming a plurality of transistors.

BACKGROUND

Over the past years, vertical nanowire Metal Oxide Semiconductor, MOS devices have been developed allowing gate-all-around geometry. This geometry offers many positive possibilities. However, there is an issue with spread in all semiconductor devices. The spread can be due to process variations and mismatch spread. The process variations are how the process varies between different runs, batch-to-batch, wafer-to-wafer and die-to-die. Mismatch spread means differences in parameters of devices that are in close proximity to each other. Such device parameters include the threshold voltage, the subthreshold slope, the gate-source capacitance ($C_{gs}$), the gate-drain capacitance ($C_{ds}$) and many more. Spread in the device parameters can be caused by irregularities in the gas flows, doping concentrations, dislocations and multiple more reasons. Mismatch is something that always should be mitigated, both in the manufacturing process and by the circuit designer. Simply explained, mismatch spread is proportional to the distance between the devices on the die. The longer the distance is, the larger the spread becomes. The circuit designer can reduce the effect of mismatch spread by placing the components closer to each other and in symmetrical geometries.

SUMMARY

An object of the present inventive concept is to, at least partly, overcome one or more of the above-identified limitations of the prior art.

According to an aspect of the present inventive concept there is provided a semiconductor structure forming a plurality of transistors. The semiconductor structure comprising a source layer; a plurality of vertical nanowires erecting from the source layer; a first spacer layer arranged on the source layer and around each of the plurality of vertical nanowires; a gate layer arranged on the first spacer layer and around each of the plurality of vertical nanowires; a second spacer layer arranged on the gate layer and around each of the plurality of vertical nanowires; and a drain layer arranged on the second spacer layer and in contact with each of the plurality of vertical nanowires. The gate layer comprises a first gate and a second gate each comprising a plurality of gate fingers. The first gate comprises a first interconnecting gate portion interconnecting the gate fingers of the first gate. The second gate comprises a second interconnecting gate portion interconnecting the gate fingers of the second gate. The plurality of gate fingers of the first gate is interleaved with the plurality of gate fingers of the second gate. The first gate is a gate of a first transistor and the second gate is a gate of a second transistor.

Each of the plurality of transistors may form vertical nanowire transistor, such as a FET or a MOSFET. By a vertical nanowire transistor is hereby meant that the semiconductor structure comprises a source portion and a drain portion arranged vertically in relation to each other. In between the source and the drain, there is at least one gate. Vertically from source, through gate and to the drain nanowires are extending. The nanowires constitute the vertical channel of the respective transistor.

As used herein, the term "vertical" denotes a direction of orientation (e.g. of a surface, a dimension or other feature) parallel to a normal direction of a layer (i.e. a main plane of extension or main/upper surface thereof). The term "horizontal" meanwhile denotes a direction or orientation parallel to the layer (i.e. a main plane of extension or main surface thereof), or equivalently transverse to the vertical direction.

For instance, by a "vertical nanowire" is hereby meant that the nanowire height extends parallel, or substantially parallel, to a normal of the layers of the semiconductor structure.

In the present invention, the source, gate and/or drain layers of at least two transistors are interleaved. The interleaving may be performed by interleaving a finger structure of at least one of the terminals (source, gate and drain), for instance the gate. It may be such that the drain and/or the source has an interleaved finger structure as well.

By finger structure, or fingers, it is meant that the gate, drain and/or source has protrusions, such as fingers, from an interconnecting portion. The interconnecting portion ensures that the fingers are interconnected. The fingers of the gate, drain and/or source are horizontally separated from each other. The separation allows for the interleaving with at least one other gate, drain or source having a finger structure. The interleaving means that the fingers of one transistor are fitted into the space between the fingers of at least one other transistor. The at least two transistors are aligned in the horizontal plane.

By interleaving the transistors, the distance between the transistors may be reduced. Since mismatch spread is proportional to the distance between devices in a die, the longer the distance between the devices is, the larger the mismatch. A common solution to the mismatch problem is to place the devices close to each other in a symmetrical geometry. Thus, by interleaving the at least two transistors the problem of mismatch is largely reduced. This can be done in a planar structure. By the solution as presented in the present invention, using a vertical structure in combination with interleaving the device allows for individual source degeneration of the different transistors in a common source topology. This is not possible using a planar transistor structure without increasing the area or sharing a common source diffusion.

The source layer may be a common source layer for the plurality of transistors. The source layer may comprise a first source and a second source. The first source may be a source of the first transistor and the second source may be a source of the second transistor. The first source and the second source each may comprise a plurality of source fingers. The first source may comprise a first interconnecting source portion. The second source may comprise a second interconnecting source portion. The plurality of source fingers of the first source may be interleaved with the plurality of source fingers of the second source.

A subset of the plurality of vertical nanowires may interconnect each source finger of the first source, each gate finger of the first gate and each drain finger of the first drain, and wherein a subset of the plurality of vertical nanowires interconnect each source finger of the second source, each gate finger of the second gate and each drain finger of the second drain. The subset of the plurality of nanowires may be 1 vertical nanowire, or 10 vertical nanowires, 100 vertical nanowires, or 1000 vertical nanowires or any other number of vertical nanowires that form a transistor current channel between the terminals of the transistor(s).

The plurality of vertical nanowires may comprise a core portion and a shell portion. The shell portion may circumscribe the core portion at least along a portion of a height of the vertical nanowire. This allows for a combination of two different materials.

The drain layer may comprise a first drain and a second drain. Each of the first and the second drain may comprise a plurality of drain fingers. The first drain may comprise a first interconnecting drain portion. The first interconnecting drain portion may interconnect the drain fingers of the first drain. The second drain may comprise a second interconnecting drain portion. The second interconnecting drain portion may interconnect the drain fingers of the second drain.

BRIEF DESCRIPTION OF THE DRAWINGS

It should be noted that in the drawings the relative dimensions of the shown elements, such as the height, width or thickness of elements, is merely schematic and may, for the purpose of illustrational clarity, differ from a physical structure.

DETAILED DESCRIPTION

Figure 1:
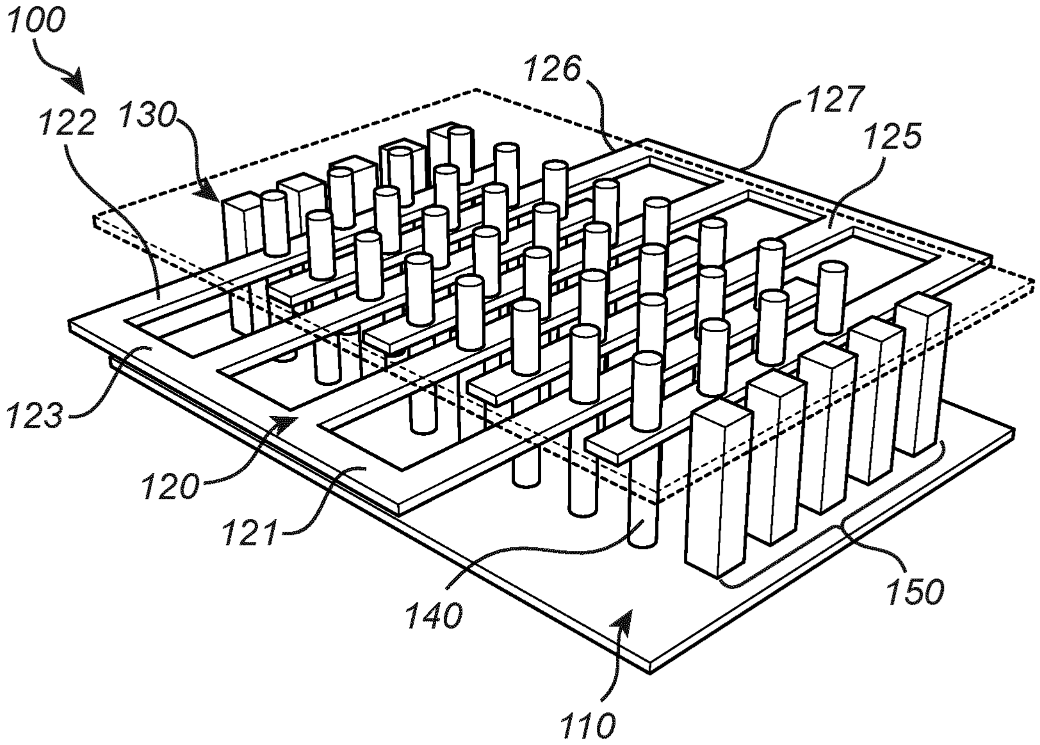
FIG. 1 illustrates a perspective view of a semiconductor structure in the form of a varactor comprising a first transistor and a second transistor. In the varactor drain and source of the first transistor as well as drain and source of the second transistor are connected with metal vias.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and to fully convey the scope of the invention to the skilled person.

Examples of various semiconductor structures for forming a plurality of vertical transistors will now be disclosed in connection with the FIGS. 1-4.

Common for all the semiconductor structures is that the respective semiconductor structure comprises a stack of layers. The stack of layers comprises a source layer 110, a gate layer 120, and a drain layer 130. A typical thickness of a layer in the stack may be in a range of 10 to 500 nm.

The source layer 110 may comprise a semiconductor material. Such as at least one of the materials selected from indium arsenide (InAs) or silica (Si).

The drain layer 130 may comprise a metal. Such as at least one of the materials selected from gold or copper.

The gate layer 120 may comprise a metal. Such as at least one of the materials selected from wolfram, copper or polysilicon.

A plurality of vertical nanowires 140 are erecting from the source layer 110, through the gate layer 120 to the drain layer 130. The nanowires 140 may be arranged on the source layer 110. The nanowires 140 may be protruding through the source layer 110 from an underlaying substrate layer. Each of the plurality of vertical nanowires 140 may comprise a core portion and a shell portion circumscribing the core portion at least along a portion of a height of the vertical nanowire. The number of vertical nanowires 140 may be in the range of 1-1000 nanowires. The vertical nanowires 140 may comprise a semiconductor material. Such as at least one of the materials selected from InAs, indium gallium arsenide (InGaAs), Si, carbon naotubes or a combination thereof. A diameter of each nanowire may be in the range of 5-100 nm. The core portion may comprise InAs, InGaAs or a combination thereof. The core portion may comprise a gradient of the material. The core portion may comprise only InAs close to one of the terminals, such as the source. The core portion may comprise only InGaAs close to another one of the terminals, such as the drain. The shell portion may comprise a semiconductor material, such as InGaAs.

The plurality of vertical nanowires 140 may be adapted to (in use of the transistors) conduct a vertical flow of charge carriers between the terminals of the transistor, e.g. between the source layer 110 and the drain layer 130. Hence, a transistor current may flow through the vertical nanowires 140, i.e. the current flows vertically through the transistor(s). The vertical nanowires 140 may be arranged on the source layer 110. The vertical nanowires 140 may be grown from the source layer 110. The source layer 110 may enfold the vertical nanowires 140. The vertical nanowires 140 may extend from the source layer 110, through the gate layer 120 to the drain layer 130.

The gate layer 120 may at least partially enclose a channel portion of the vertical nanowires 140. In particular, the gate layer 120 may wrap-around the channel portion, in other words forming a gate-all-around (GAA) structure.

Further, common for the respective semiconductor structure is that a first spacer layer is arranged between the source layer 110 and the gate layer 120. For the simplicity of the drawings the first spacer layer is not seen in the figures. The first spacer layer may be arranged on the source layer 110. The first spacer layer is further arranged around each of the plurality of vertical nanowires 140. Hence, the first spacer layer may circumscribe the vertical nanowires 140. The first spacer layer may be abutting at least some of the vertical nanowires 140 along a vertical extension thereof. The first spacer layer may circumscribe at least some of the vertical nanowires 140 at a distance therefrom. The first spacer layer is abutting the source layer 110 and the gate layer 120. The first spacer layer may comprise a dielectric material. Such as at least one of the materials selected from $SiO_2$, benzocyclobutene (BCB) or air.

Moreover, common for the respective semiconductor structure is that a second spacer layer is arranged between the gate layer 120 and the drain layer 130. For the simplicity of the drawings the second spacer layer is not seen in the figures. The second spacer layer may be arranged on the gate layer. The second spacer layer is further arranged around each of the plurality of vertical nanowires 140. Hence, the second spacer layer may circumscribe the vertical nanowires 140. The second spacer layer may be abutting at least some of the vertical nanowires 140 along a vertical extension thereof. The second spacer layer may circumscribe at least some of the vertical nanowires 140 at a distance therefrom. The second spacer layer is abutting the gate layer 120 and the drain layer 130. The second spacer layer may comprise a dielectric material. Such as at least one of the materials selected from $SiO_2$, benzocyclobutene (BCB) or air.

The first and second spacer layers may be formed from a common material.

FIG. 1 shows a perspective view of a semiconductor structure 100 forming varactor comprising a first transistor and a second transistor. The source layer 110 is a common source for the first transistor and the second transistor. The drain layer 130 is a common drain for the first transistor and the second transistor. The source layer 110 is electrically connected to the drain layer 130 by vias 150. The vias 150 are typically formed by a metal material having good electrical conductivity.

The gate layer 120 comprises a first gate 121 and a second gate 125. The first gate 121 is a gate of the first transistor. The second gate is 125 is a gate of the second transistor. Each of the first gate 121 and the second gate 125 comprises a plurality of gate fingers 122, 126. It should be noted that in FIG. 1 and the following figures, the finger structure is depicted as 4 fingers, however it may be any other number of fingers. The first gate 121 comprises a first interconnecting portion 123. The first interconnecting portion 123 interconnects the gate fingers 122 of the first gate 121. The second gate 125 comprises a second interconnecting portion 127. The second interconnecting portion 127 interconnects the gate fingers 126 of the second gate 125. The first and the second gate fingers 122, 126 may extend horizontally from the first and second interconnecting portions, 121, 125, respectively. The first and the second interconnecting portions 123, 127 may each be a backbone from which each of the plurality of gate fingers 122, 126 extend horizontally. The first and the second interconnecting portions 123, 127 may be opposite each other in a horizontal plane. The plurality of gate fingers of the first gate 122 is interleaved with the plurality of gate fingers of the second gate 126. By interleaving the gate fingers 122, 126, the distance between the first transistor and the second transistor may be reduced.

A first subset of the plurality of vertical nanowires 140 interconnects the source layer 110, each gate finger 122 of the first gate 121 and the drain layer 130. A second subset of the plurality of vertical nanowires 140 interconnect the source layer 110, each gate finger 126 of the second gate 125 and the drain layer 130. It should be noted that in FIG. 1 and the following figures, each subset of the plurality of nanowires are depicted as 4. However, the number of vertical nanowires 140 in each subset may vary. For example, each subset may comprise 1, 10, 100, 1000 or more vertical nanowires. Moreover, the number of vertical nanowires 140 in the first subset may be different from the number of vertical nanowires 140 in the second subset. Moreover, gate fingers 122 of the first gate 121 may be connected to the source and drain layers 110, 130 using different number of vertical nanowires 140. Furthermore, gate fingers 126 of the first gate 125 may be connected to the source and drain layers 110, 130 using different number of vertical nanowires 140.

The current of the transistor travels vertically through the nanowires 140, acting as a current channel of the respective transistor, from the source to the drain, or vice versa.

Figure 5A:
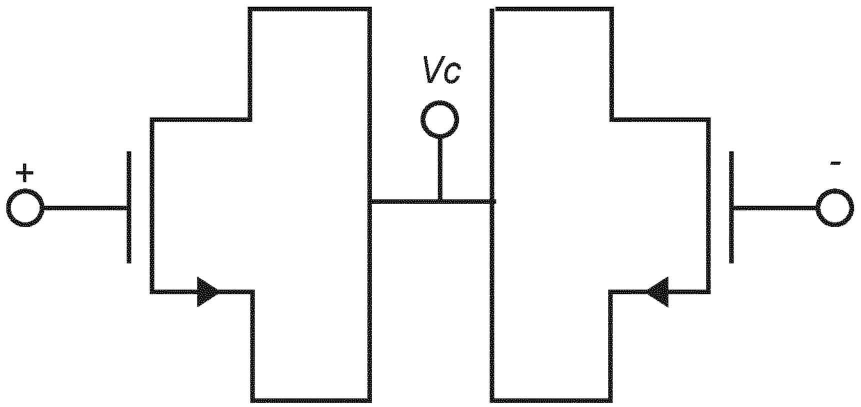
FIG. 5*a* is a circuit diagram for a MOS-varactor formed by two NMOS-transistors formed by the semiconductor structure illustrated in FIG. 1.
Figure 5B:
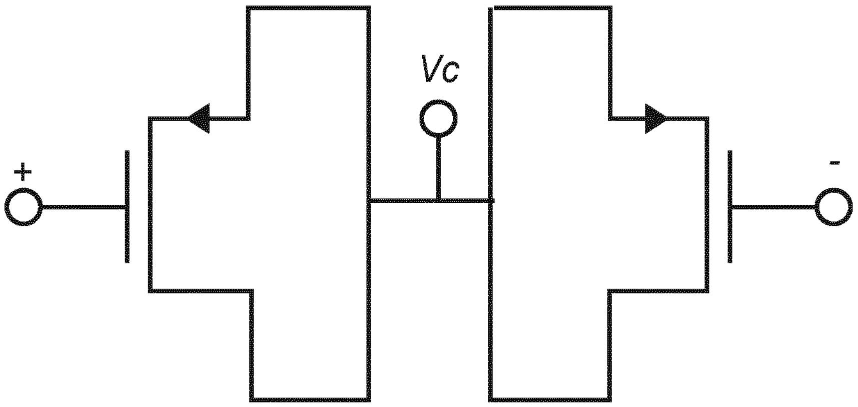
FIG. 5*b* is a circuit diagram for a MOS-varactor formed by two PMOS-transistors formed by the semiconductor structure illustrated in FIG. 1.

Hence, a varactor can be implemented in an interleaved geometry as seen in FIG. 1. The MOS-varactor is two MOS-transistors connected as in FIG. 5. Low mismatch in the varactor is very important when used in e.g. a Quadrature Voltage-Controlled Oscillator (QVCO) to reduce the phase imbalance. The interleaved structure will reduce mismatch spread.

Figure 2:
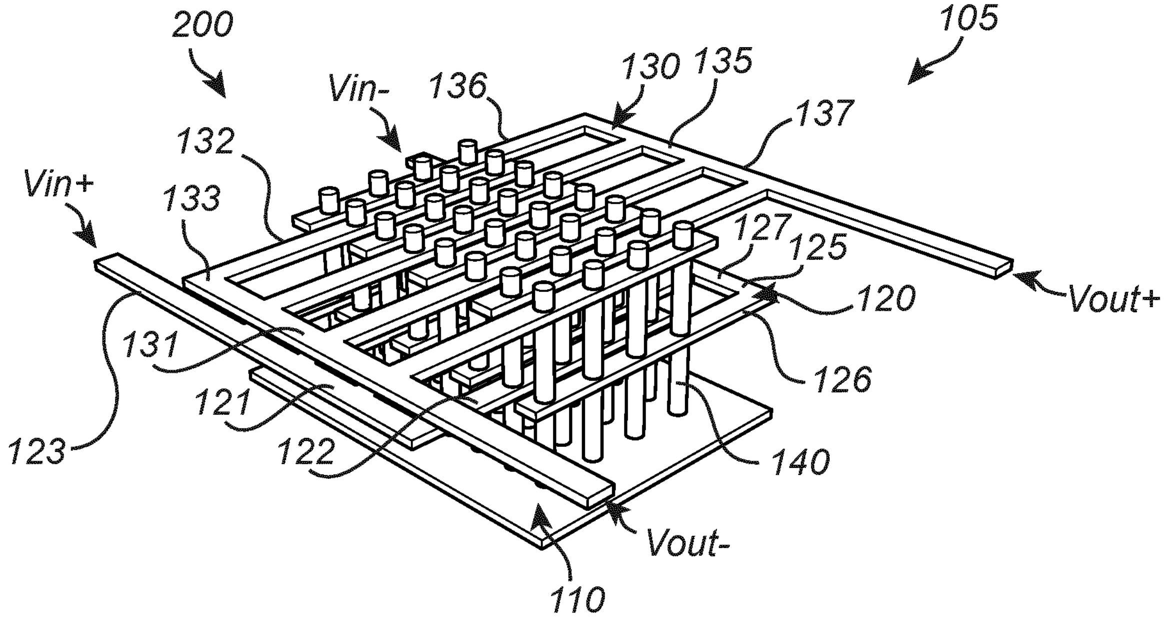
FIG. 2 illustrates a perspective view of a semiconductor structure in the form of a differential common source amplifier comprising a first transistor and a second transistor with vertical nanowire transistors. The gate and drain layer are using a finger structure.

With reference to FIG. 2, a semiconductor structure 200 in the form of a common source amplifier comprising a first transistor and a second transistor will be discussed. In addition to the common features of all the semiconductor structures discussed in this disclosure, both the gate layer 120 and the drain layer 130 are divided into two separate portions.

Hence, the gate layer 120 comprises a first gate 121 and a second gate 125. The first gate 121 is a gate of the first transistor. The second gate is 125 is a gate of the second transistor. Each of the first gate 121 and the second gate 125 comprises a plurality of gate fingers 122, 126. The first gate 121 comprises a first interconnecting portion 123. The first interconnecting portion 123 interconnects the gate fingers 122 of the first gate 121. The second gate comprises a second interconnecting portion 127. The second interconnecting portion 127 interconnects the gate fingers 126 of the second gate 125. The first and the second gate fingers 122, 126 may extend horizontally from the first and second interconnecting portions 121, 125, respectively. The first and the second interconnecting portions 123, 127 may each be a backbone from which each of the plurality of gate fingers 122, 126 extend horizontally. The first and the second interconnecting portions 123, 127 may be opposite each other in a horizontal plane. The plurality of gate fingers of the first gate 122 is interleaved with the plurality of gate fingers of the second gate 126.

Further, for semiconductor structure 200 the drain layer 130 comprises a first drain 131 and a second drain 135. The first drain 131 is a drain of the first transistor. The second drain 135 is a drain of the second transistor. The first drain 131 comprises a plurality of drain fingers 132 and a first interconnecting drain portion 133. The first interconnecting drain portion 133 interconnects the drain fingers of the first drain 131. The second drain 135 comprises a plurality of drain fingers 136 and a second interconnecting drain portion 137. The second interconnecting drain portion 137 interconnects the drain fingers of the second drain 135. The first and the second drain fingers 132, 136 may extend horizontally from the first and second interconnecting portions 131, 135, respectively. The first and the second interconnecting portions 133, 137 may each be a backbone from which each of the plurality of drain fingers 132, 136 extend horizontally. The first and the second interconnecting portions 133, 137 may be opposite each other in a horizontal plane. The plurality of drain fingers of the first drain 131 is interleaved with the plurality of drain fingers of the second drain 135.

The first drain 131 may be vertically aligned with the first gate 121. The second drain 135 may be vertically aligned with the second gate 125.

By interleaving the gate fingers 122, 126, and by interleaving the drain fingers 132, 136 the distance between the first transistor and the second transistor may be reduced.

A first subset of the plurality of vertical nanowires 140 extend between each gate finger 122 of the first gate 121 and each drain finger 132 of the first drain 131. A second subset of the plurality of vertical nanowires 140 extend between each gate finger 126 of the second gate 125 and each drain finger 136 of the second drain 135. As discussed above in connection with FIG. 1 the number of vertical nanowires in the first and second subset may vary.

Figure 6A:
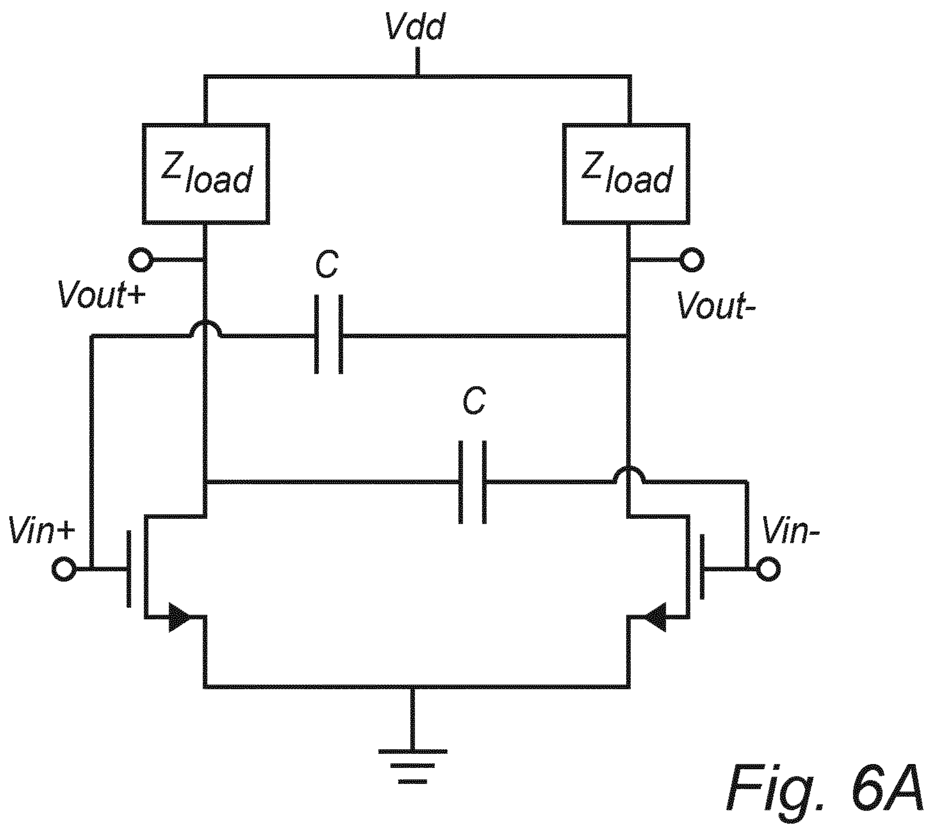
FIG. 6*a* is a circuit diagram for a differential NMOS amplifier with cross coupled capacitances formed by the semiconductor structure of FIG. 2.
Figure 6B:
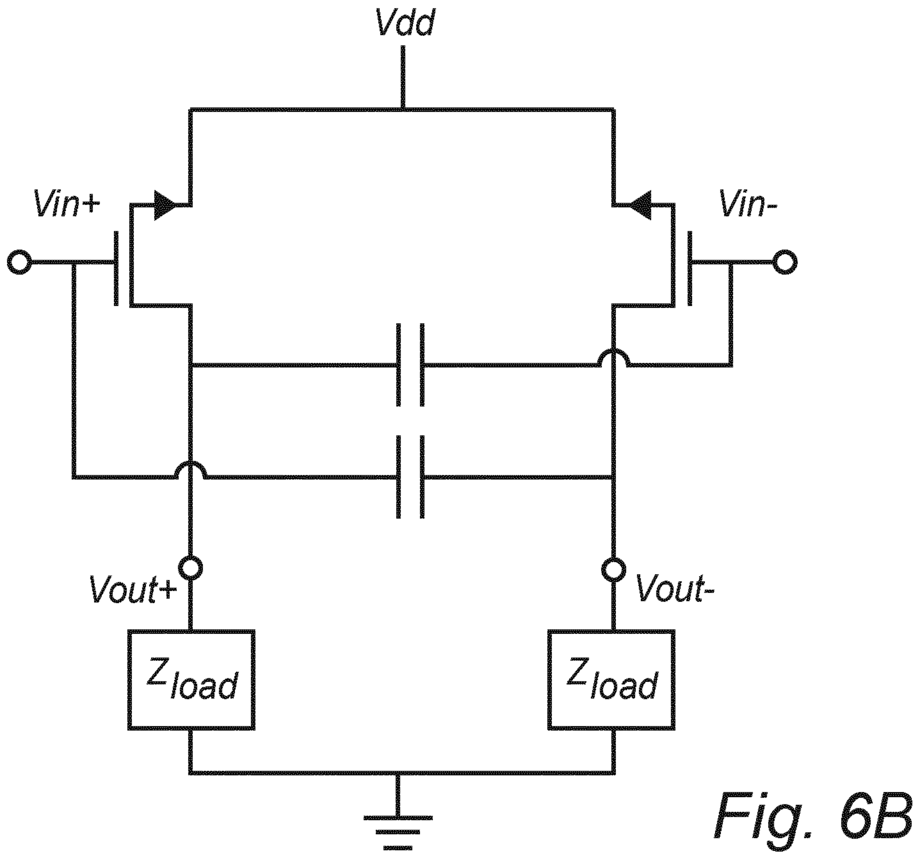
FIG. 6*b* is a circuit diagram for a differential PMOS amplifier with cross coupled capacitances formed by the semiconductor structure of FIG. 2.
Figure 7A:
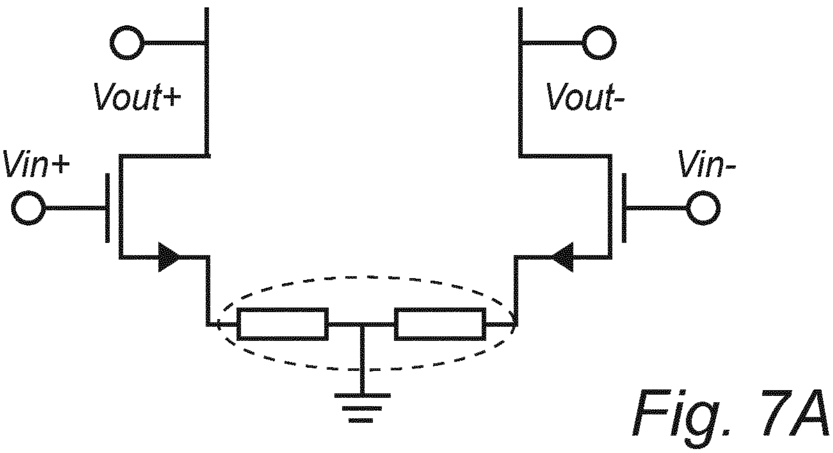
FIG. 7*a* is a circuit diagram for a differential NMOS amplifier formed by the semiconductor structure illustrated in FIG. 3.
Figure 7B:
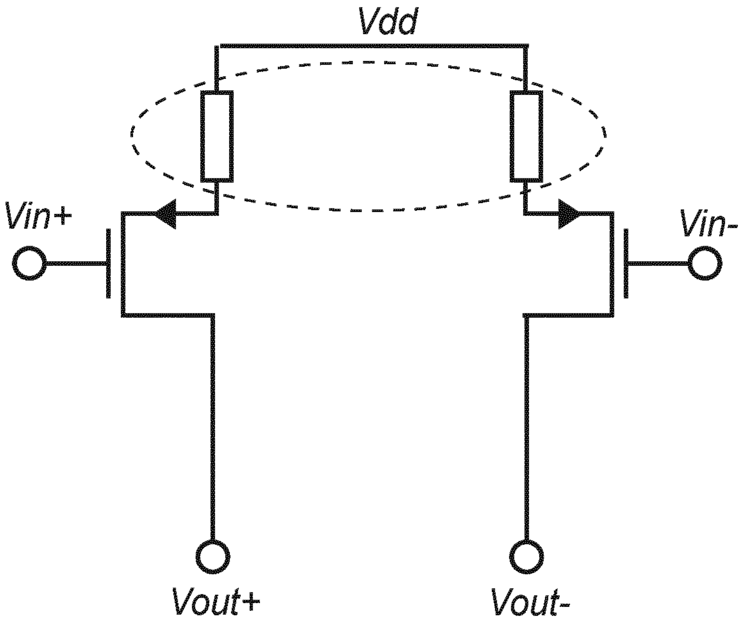
FIG. 7*b* is a circuit diagram for a differential PMOS amplifier formed by the semiconductor structure illustrated in FIG. 3.
Figure 8A:
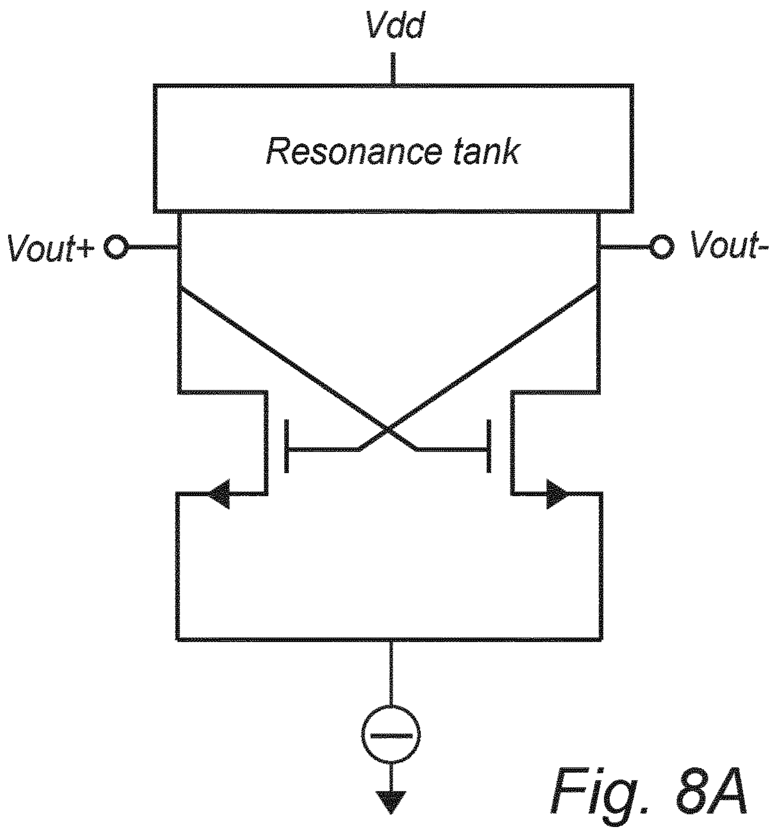
FIG. 8*a* is a circuit diagram for a NMOS VCO core formed by the semiconductor structure of FIG. 4.
Figure 8B:
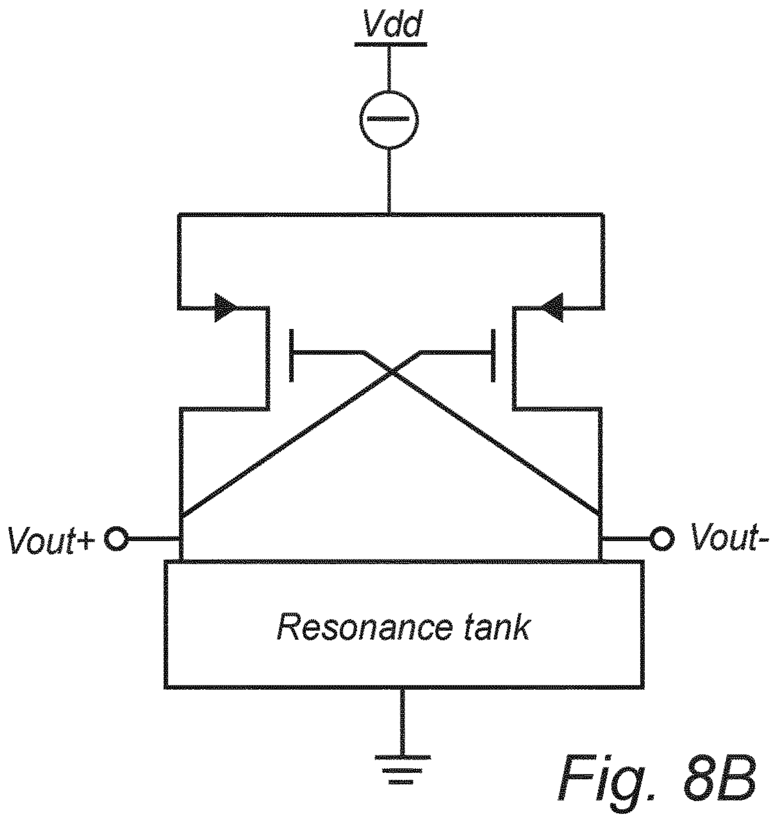
FIG. 8*b* is a circuit diagram for a PMOS VCO core formed by the semiconductor structure of FIG. 4.

As shown in FIG. 2, the gate for Vin+ overlaps with the drain Vout−. The gate for Vin− (not shown in the figure) overlaps with the drain for Vout+. The overlap between the first interconnecting portion 123 of the first gate 121 and the first interconnecting portion 133 of the first drain 131 may form a first capacitor. The overlap between the second interconnecting portion 127 of the second gate 125 and the second interconnecting portion 137 of the second drain 135 may form a second capacitor. The capacitance of the first and/or the second capacitor(s) may be tuned by changing the amount of overlap between the respective interconnecting portions 123, 133; 127, 137 and/or a distance between the gate layer 120 and the drain layer 130. A semiconductor structure 200 wherein the first and second capacitors are formed may form a positive feedback amplifier with cross coupled capacitances. A circuit diagram of such a feedback amplifier is illustrated in FIG. 6. Implementing the capacitors this way may reduce the distance from the transistor and thus minimizing the parasitic inductance.

Figure 3:
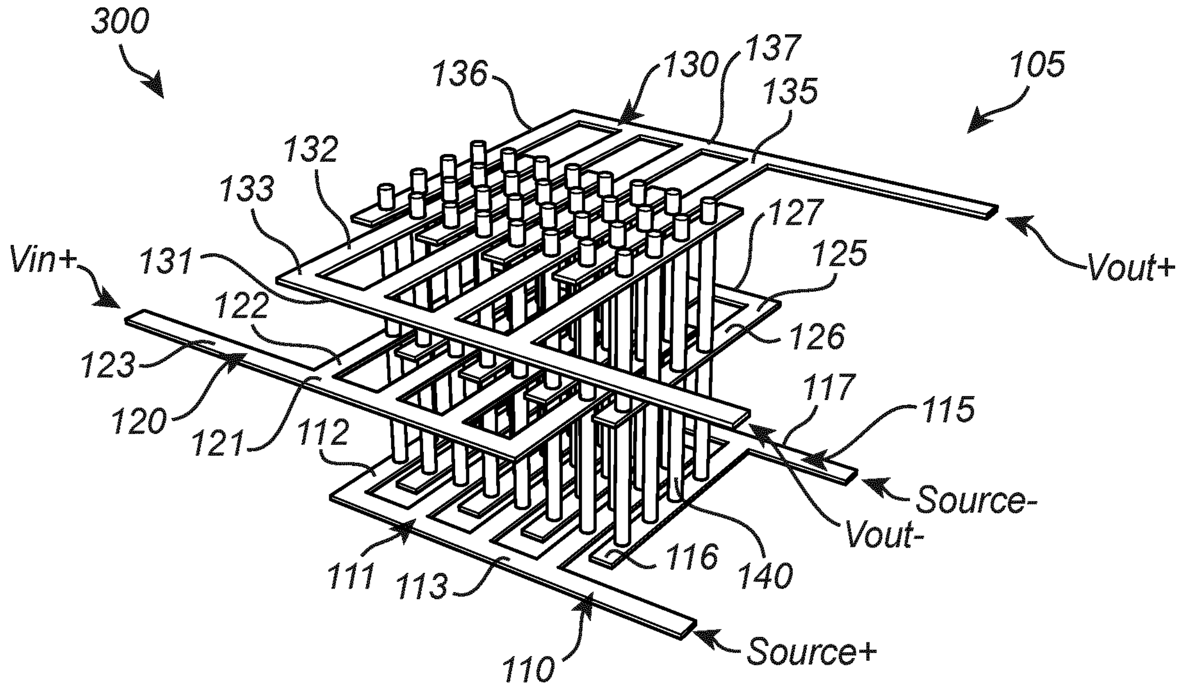
FIG. 3 illustrates a perspective view of a semiconductor structure of a differential amplifier comprising a first transistor and a second transistor with vertical nanowire transistors. The source, gate and drain layer are using a finger structure.

In FIG. 3 a semiconductor structure 300 of a layout with vertical nanowire transistors is illustrated. In the semiconductor structure 300 also the source layer 110 is split into two interleaved portions. Hence, the source layer 110, the gate layer 120 and the drain layer 130 comprises a first and second portion, respectively, wherein fingers of the respective first and second portion of the respective layer are interleaved. The interleaving of the portions of the gate layer 120 and the portions of the drain layer 130 is discussed above in connection with the semiconductor structures 100, 200 of FIG. 1 and FIG. 2 and will not be repeated in connection with the discussion in connection with the semiconductor structure 300 of FIG. 3. Instead, reference is made to the description above, this in order to avoid undue repetition.

The semiconductor structure 300 of FIG. 3 is an example of an amplifier with vertical nanowire transistors.

The source layer 110 of the semiconductor structure 300 of FIG. 3 comprises a first source 111 and a second source 115. The first source 111 is a source of the first transistor. The second source 115 is a source of the second transistor. The first source 111 comprises a plurality of source fingers 112 and a first interconnecting source portion 113. The first interconnecting source portion 113 interconnect the source fingers of the first source 112. The second source 115 comprises a plurality of source fingers 116 and a second interconnecting source portion 117. The second interconnecting source portion 117 interconnect the source fingers of the second source 116. The first and the second source fingers 112, 116 may extend horizontally from the first and second interconnecting portions 111, 115, respectively. The first and the second interconnecting portions 113, 117 may each be a backbone from which each of the plurality of source fingers 112, 116 extend horizontally. The first and the second interconnecting portions 113, 117 may be opposite each other in a horizontal plane. The plurality of source fingers 112 of the first source 111 is interleaved with the plurality of source fingers 116 of the second source 115.

The first source 111 may be vertically aligned with the first gate 121 and the first drain 131. The second source 115 may be vertically aligned with the second gate 125 and the second drain 135.

A first subset of the plurality of vertical nanowires 140 interconnect each source finger 112 of the first source 111, each gate finger 122 of the first gate 121 and each drain finger 132 of the first drain 131. A second subset of the plurality of vertical nanowires 140 interconnect each source finger 116 of the second source 115, each gate finger 126 of the second gate 125 and each drain finger 136 of the second drain 135. Thus, in FIG. 3 none of the source, drain or gate terminals are shared between the first transistor and the second transistor. This is an advantage compared to the prior art, since individual functionalities may be adapted to each transistor while yet keeping the distance between them low. For instance, individual source degeneration with passive components is possible for this structure. As shown in FIG. 3, the gate for Vin+ overlaps with the drain Vout−. The gate for Vin− (not shown in the figure) overlaps with the drain for Vout+.

The overlap between the first interconnecting portion 123 of the first gate 121 and the first interconnecting portion 133 of the first drain 131 may form a first capacitor. The overlap between the second interconnecting portion 127 of the second gate 125 and the second interconnecting portion 137 of the second drain 135 may form a second capacitor. The capacitance of the first and/or the second capacitor(s) may be tuned by changing the amount of overlap between the respective interconnecting portions 123, 133; 127, 137 and/or a distance between the gate layer 120 and the drain layer 130.

Figure 4:
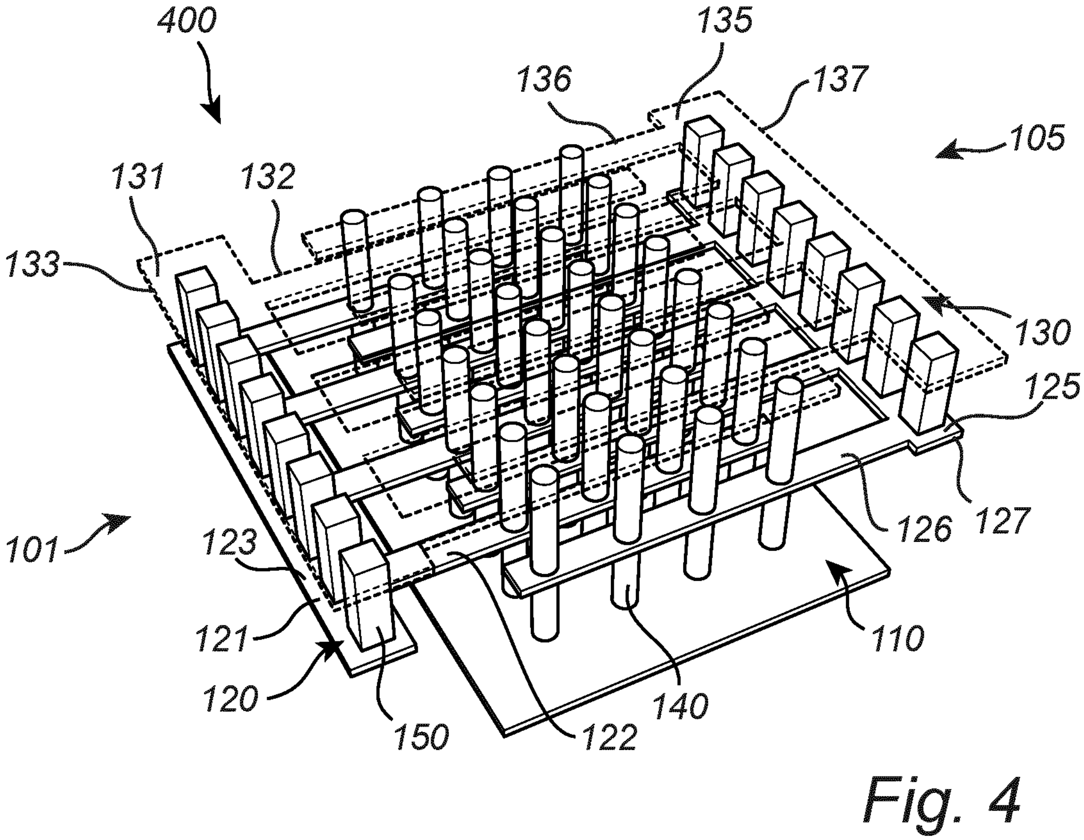
FIG. 4 illustrates a perspective view of a semiconductor structure forming the core of a voltage-controlled oscillator, VCO.

In connection with FIGS. 4, a yet alternative embodiment of a device formed by interleaving fingers of two different portions of a source, a gate and/or a drain layer in a semiconductor structure is illustrated. According to this embodiment a semiconductor structure 400 forming a voltage-controlled oscillator core, is illustrated. A circuit diagram of the VCO core is disclosed in FIGS. **8*a* and 8*b***.

Both the gate layer 120 and the drain layer 130 of the semiconductor structure 400 in FIG. 4 comprises two interleaved portions. Hence, both the gate layer 120 and the drain layer 130 comprises a first and second portion, respectively, wherein fingers of the respective first and second portion of the respective layer are interleaved. The interleaving of the portions of the gate layer 120 and the portions of the drain layer 130 are discussed above in connection with the semiconductor structures 100, 200 of FIG. 1 and FIG. 2 and will not be repeated in connection with the discussion in connection with the semiconductor structure 400 of FIG. 4. Instead, reference is made to the description above, this in order to avoid undue repetition. In addition to the semiconductor structure 200 of FIG. 2 the first interconnecting portion 123 of the first gate 121 and the second interconnecting portion 137 of the second drain 135 are interconnected by vias 150. Further, the second interconnecting portions 127 of the second gate 125 and the first interconnecting portion 133 of the first drain 131 are interconnected by vias 150. The vias 150 are preferably made of metal.

Accordingly, the inventors of the present invention have realized that by interleaving fingers of two different portions of a source, gate and/or drain layer in a semiconductor structure the distance between a first transistor and a second transistor may be reduced in a semiconductor structure comprising a two or more vertically arranged transistors. By such design mismatch in the transistor may be reduced. Further, such design will increase the design freedom in circuit design for semiconductor structures.

Hence, the mismatch spread can be reduced by moving the transistors physically closer to each other on a chip. The mismatch spread is proportional to the distance between the transistors. Interleaving the fingers of the sources, gates and/or drains will achieve a minimum distance between the transistors and thus reduce the mismatch spread.

Considering the vertical geometry, it is possible to interleave two transistors by extending the fingers through the source, gate and drain layers. Splitting the source into fingers as in FIG. 3 will not increase the device footprint compared to FIG. 2. This is a benefit compared to the planar technology where the footprint is increased when the source is not shared between devices.

This approach means that individual source degeneration with passive components is made possible without an area increase. The individual source degeneration may reduce the mismatch spread if the spread of the degeneration component is lower than the spread of the transistor. Source degeneration may consist of any combination of circuit elements, for instance a resistor or an inductor.

The present invention as described above illustrates that interleaving of vertical transistors can be used in order to reduce mismatch spread in integrated circuits. Any integrated circuit that would benefit from reduced mismatch could benefit from the presented invention, this could be but is not limited to amplifiers, VCOs, varactors, current mirrors, buffers etc.

The person skilled in the art realizes that the present invention by no means is limited to the preferred embodiments described above. On the contrary, many modifications and variations are possible within the scope of the appended claims.

For example, the gate layer may further comprise an additional gate layer. The additional gate layer may be arranged between the gate layer and the drain layer. The additional gate layer may comprise a first additional gate and a second additional gate. Each additional gate may comprise a plurality of additional gate fingers. The first additional gate may comprise a first additional interconnecting gate portion. The first additional gate portion may be interconnecting the additional gate fingers of the first additional gate. The second additional gate may comprise a second additional interconnecting gate portion. The second additional gate portion may interconnect the additional gate fingers of the second additional gate. The plurality of additional gate fingers of the first additional gate may be interleaved with the plurality of additional gate fingers of the second additional gate. The second additional gate may be electrically connected to the first gate. The first additional gate may be electrically connected to the second gate. Each of the electrical connection may be made using a metal. The second additional gate together with the first gate may be a gate of the first transistor. The first additional gate together with the second gate may be a gate of a second transistor.

Additionally, variations to the disclosed embodiments can be understood and effected by the skilled person in practicing the claimed invention, from a study of the drawings, the disclosure, and the appended claims.

The invention claimed is:

1. A semiconductor structure forming a plurality of transistors, the semiconductor structure comprising:

a source layer;

a plurality of vertical nanowires erecting vertically from the source layer;

a first spacer layer arranged on the source layer and around each of the plurality of vertical nanowires;

a gate layer arranged on the first spacer layer and around each of the plurality of vertical nanowires;

a second spacer layer arranged on the gate layer and around each of the plurality of vertical nanowires;

a drain layer arranged on the second spacer layer and in contact with each of the plurality of vertical nanowires;

wherein the gate layer comprises a first gate and a second gate each comprising a plurality of gate fingers, wherein the first gate comprises a first interconnecting gate portion interconnecting the gate fingers of the first gate, wherein the second gate comprises a second interconnecting gate portion interconnecting the gate fingers of the second gate, wherein the plurality of gate fingers of the first gate is interleaved with the plurality of gate fingers of the second gate, wherein the first gate is a gate of a first transistor and the second gate is a gate of a second transistor.

2. The semiconductor structure according to claim 1, wherein the plurality of vertical nanowires are at least 100 vertical nanowires.

3. The semiconductor structure according to claim 1, wherein the plurality of vertical nanowires are at least 1000 vertical nanowires.

4. The semiconductor structure according to claim 1, wherein the drain layer comprises a first drain and a second drain each comprising a plurality of drain fingers, wherein the first drain comprises a first interconnecting drain portion interconnecting the drain fingers of the first drain, wherein the second drain comprises a second interconnecting drain portion interconnecting the drain fingers of the second drain, wherein the plurality of drain fingers of the first drain is interleaved with the plurality of drain fingers of the second drain, wherein the first drain is a drain of the first transistor and the second drain is a drain of the second transistor.

5. The semiconductor structure according to claim 4, wherein a subset of the plurality of vertical nanowires extend between each gate finger of the first gate and each drain finger of the first drain, and wherein a subset of the plurality of vertical nanowires extend between each gate finger of the second gate and each drain finger of the second drain.

6. The semiconductor structure according to claim 1, wherein the source layer comprises a first source and a second source each comprising a plurality of source fingers, wherein the plurality of source fingers of the first source is interleaved with the plurality of source fingers of the second source, wherein the first source is a source of the first transistor and the second source is a source of the second transistor.

7. The semiconductor structure according to claim 6, wherein a subset of the plurality of vertical nanowires interconnect each source finger of the first source, each gate finger of the first gate and each drain finger of the first drain, and wherein a subset of the plurality of vertical nanowires interconnect each source finger of the second source, each gate finger of the second gate and each drain finger of the second drain.

8. The semiconductor structure according to claim 1, wherein the interleaving means that the fingers of the gate, drain and/or source of the first transistor are fitted into the space between the fingers of the gate, drain and/or source of the second transistor.

9. The semiconductor structure according to claim 4, wherein the first interconnecting gate portion and the second interconnecting drain portion are vertically aligned and are forming a plate capacitor.

10. The semiconductor structure according to claim 1, wherein the source layer forms a common source for the first transistor and the second transistor.

11. The semiconductor structure according to claim 10, wherein the drain layer forms a common drain for the first transistor and the second transistor, wherein the source layer is electrically connected to the drain layer.

12. The semiconductor structure according to claim 10, wherein the first interconnecting gate portion is electrically connected to the second interconnecting drain portion, wherein the second interconnecting gate portion is electrically connected to the first interconnecting drain portion.

* * * * *